(12) United States Patent
Datta

(10) Patent No.: US 11,398,426 B2
(45) Date of Patent: Jul. 26, 2022

(54) INTEGRATED-CIRCUIT DEVICES AND CIRCUITRY COMPRISING THE SAME

(71) Applicant: SOCIONEXT INC., Kanagawa (JP)

(72) Inventor: Prabir Kumar Datta, Langen (DE)

(73) Assignee: SOCIONEXT INC., Kanagawa (JP)

( * ) Notice: Subject to any disclaimer, the term of this patent is extended or adjusted under 35 U.S.C. 154(b) by 105 days.

(21) Appl. No.: 16/876,591

(22) Filed: May 18, 2020

(65) Prior Publication Data

US 2020/0373234 A1 Nov. 26, 2020

(30) Foreign Application Priority Data

May 24, 2019 (EP) .................................... 19176615

(51) Int. Cl.
*H01L 23/522* (2006.01)
*H01L 23/528* (2006.01)
*H01L 49/02* (2006.01)
*H03K 3/03* (2006.01)

(52) U.S. Cl.
CPC ........ *H01L 23/5223* (2013.01); *H01L 23/528* (2013.01); *H01L 23/5226* (2013.01); *H01L 28/86* (2013.01); *H03K 3/0315* (2013.01)

(58) Field of Classification Search
CPC ............. H01L 23/5223; H01L 23/5226; H01L 23/528; H01L 28/86; H03K 3/0315
USPC ........................................................ 257/534
See application file for complete search history.

(56) References Cited

U.S. PATENT DOCUMENTS 7,298,001 B1 11/2007 Liu et al.
7,561,407 B1 7/2009 Chen et al.
8,766,403 B2 * 7/2014 Huang ................ H01L 27/0207
257/532
8,971,014 B2 3/2015 Hua et al.
9,177,909 B2 11/2015 Shih
2004/0174655 A1 9/2004 Tsai et al.
(Continued)

FOREIGN PATENT DOCUMENTS

EP 2 680 308 A2 1/2014

OTHER PUBLICATIONS

Extended European Search Report issued in European Patent Application No. 19176615.3, dated Nov. 26, 2019.

*Primary Examiner* — Tu-Tu V Ho
(74) *Attorney, Agent, or Firm* — McDermott Will & Emery LLP

(57) ABSTRACT

An integrated-circuit device having a layered structure including a plurality of wiring layers with a via layer sandwiched between adjacent wiring layers, wherein: a capacitor having first and second terminals is formed from conductive structures implemented in first and second wiring layers, the conductive structures including arrangements of conductive strips; the strips formed in the first wiring layer are organized into a first-terminal comb arrangement connected to the first terminal and a second-terminal comb arrangement connected to the second terminal, each of comb arrangements having a base strip and a plurality of finger strips extending from the base strip; and the strips formed in the second wiring layer include a plurality of separate strips which constitute finger strips of a cross-layer comb arrangement whose base strip is a finger strip of the first-terminal comb arrangement of the first wiring layer to which those separate strips are conductively connected by vias.

13 Claims, 13 Drawing Sheets

(a) Comparative Example 1

(b) Comparative Example 2

(c) Embodiment

(56) References Cited

U.S. PATENT DOCUMENTS

| | | |
|---|---|---|
| 2007/0228520 A1 | 10/2007 | Winn et al. |
| 2008/0079117 A1 | 4/2008 | Baumgartner et al. |
| 2010/0164067 A1 | 7/2010 | Sugisaki et al. |
| 2010/0309605 A1 | 12/2010 | Lin |
| 2012/0326270 A1 | 12/2012 | Thompson et al. |
| 2013/0049088 A1 | 2/2013 | An et al. |
| 2014/0367827 A1 | 12/2014 | Lee et al. |
| 2018/0315548 A1 | 11/2018 | Wang et al. |

* cited by examiner (a) Comparative Example 1

(b) Comparative Example 2

(c) Embodiment

INTEGRATED-CIRCUIT DEVICES AND CIRCUITRY COMPRISING THE SAME

CROSS-REFERENCE OF RELATED APPLICATIONS

This application claims the benefit of European Patent Application No. 19176615.3, filed on May 24, 2019, the entire disclosure of which Application is incorporated by reference herein.

The present invention relates to integrated-circuit devices or components having a layered structure typically formed on a substrate, and in particular to capacitors implemented as such integrated-circuit devices.

The layered structure may comprise a plurality of wiring layers and via layers sandwiched between adjacent wiring layers. Semiconductor integrated circuitry may have such a layered structure and comprise such devices.

It has been considered that capacitors may be provided as or as part of integrated-circuit devices. Such devices may be provided on-chip, either alone or along with other circuitry, for example implemented as a MOM (Metal-Oxide-Metal) capacitor. Typically, such a capacitor may be implemented by providing multiple unit MOM cells (unit capacitors) connected or connectable together to provide multi-unit capacitors having the required capacitance. Such MOM capacitors may be considered inter-digitated multi-finger capacitors formed by multiple wiring (metal) layers in the layered structure of wiring layers of the semiconductor integrated circuitry (i.e. IC chip), connected together as appropriate with vias in the via layers (inter-wiring-layer dielectrics) provided between the wiring layers concerned.

With this in mind, integrated-circuit devices herein may be referred to as semiconductor integrated circuit devices or semiconductor integrated circuitry.

It has been found that previously-considered MOM capacitors (and their unit MOM cells) do not provide sufficient capacitance per unit area of the layer structure.

It is desirable to address the above problems.

According to an embodiment of a first aspect of the present invention there is provided an integrated-circuit device having a layered structure, the layered structure comprising a plurality of wiring layers with a via layer sandwiched between adjacent said wiring layers, wherein: a capacitor having first and second terminals is formed from conductive structures implemented in at least first and second said wiring layers, the conductive structures comprising arrangements of conductive strips; the strips formed in the first wiring layer are organized into at least a first-terminal comb arrangement conductively connected to the first terminal and a second-terminal comb arrangement conductively connected to the second terminal, each of those comb arrangements having a base strip and a plurality of finger strips extending from the base strip; and the strips formed in the second wiring layer comprise a plurality of separate strips which constitute finger strips of a cross-layer comb arrangement whose base strip is a finger strip of the first-terminal comb arrangement of the first wiring layer to which those separate strips are conductively connected by vias.

The wiring layers may be considered metal layers of a semiconductor IC layered structure, for example. The integrated-circuit device (or component) may be referred to as a semiconductor integrated circuit device (or component), or as a capacitor, or as integrated circuitry or as semiconductor integrated circuitry. The capacitor may be referred to as a capacitor structure, e.g. a MOM capacitor structure. The comb arrangements may be referred to as comb structures or comb electrodes.

It will be appreciated that the arrangement of conductive (e.g. metal) structures leads to a particularly compact capacitor with high capacitance per unit area of the layer structure.

Related optional features, and related aspects, are defined in a set of statements at the end of the description.

According to an embodiment of a second aspect of the present invention there is provided a semiconductor device including a (e.g. MOM) capacitor structure, the capacitor structure comprising: a pair of first comb electrodes that are disposed opposite to each other in a first layer, each of the first comb electrodes including a plurality of first finger wirings which extend in a first direction and a first base wiring which connects the plurality of first finger wirings; a pair of unit electrodes that are disposed in a second layer above the first layer, each of the unit electrodes including a plurality of parallel wirings which extend in a second direction perpendicular to the first direction, a parallel wiring of one unit electrode being disposed between adjacent parallel wirings of the other unit electrode; and a pair of second comb electrodes that are disposed opposite to each other in a third layer above the second layer, each of the second comb electrodes including a plurality of second finger wirings which extend in the first direction and a second base wiring which connects the plurality of second finger wirings, wherein each parallel wiring of the unit electrodes is electrically connected to both a corresponding first finger wiring of the first comb electrodes and a corresponding second finger wiring of the second comb electrodes in the edge portion of the parallel wiring through vias.

Reference will now be made, by way of example only, to the accompanying Figures, of which:

FIG. 1A is a schematic diagram of an example layer structure which may be adopted when implementing integrated-circuit devices and corresponding circuitry (integrated circuitry, or semiconductor integrated circuitry) embodying the present invention. The particular number and labelling of the layers is of course just an example.

A substrate layer is provided at the bottom, followed by a contact layer (VIA0) and then alternating wiring (e.g. M1) and via (e.g. VIA1) layers as indicated. The wiring layers will be referred to as metal layers herein. For example, wiring layer M1 will be referred to as metal layer M1. An upwards direction is defined through the layers away from the substrate as shown.

The indications "AP" (for Metal 11) and "RV" (for Via 10) are simply labels corresponding to an example implementation. The label AP indicates that the top metal layer may be an aluminium layer (whereas the lower layers may be copper layers) and used for connection pads (hence AP) and the connections to them. The via layer (VIA10) adjacent to this "redistribution layer" (Metal 11) is labelled RV. The AP or Metal 11 layer will be referred to herein as a routing layer and connections made in this layer will be referred to as routings. Such a routing layer typically includes traces/routings interconnecting integrated circuit bond-pads to under-bump metallizations (not shown) formed on top of the routing layer, each for connection to a corresponding solder bump of the finished IC chip.

Signal lines (wirings) may be implemented in the metal layers (e.g., in layers M8 and M9), with connections between the layers being made by vias implemented in the intermediate via layers or inter-metal dielectrics (e.g., in layer VIA8).

The metal layers M1 to M5 may be considered lower layers, the metal layers M6 to M8 intermediate layers, and the metal layers M9 to AP upper layers, but this is just an example. The metal layers may get thinner in the downwards direction, with density and resistivity of structures/tracks also increasing in that direction.

Figure 1A:
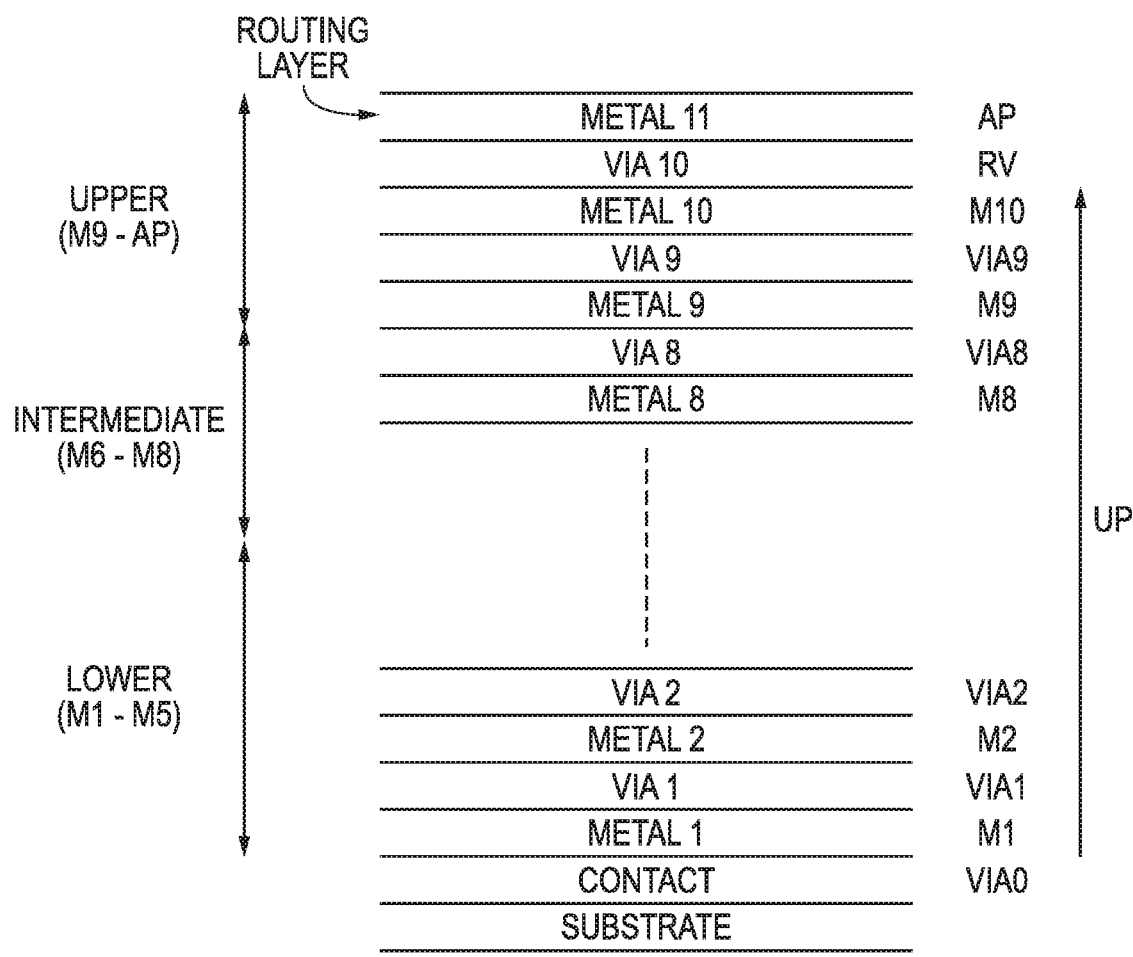
FIG. 1A is a schematic diagram of an example layer structure which may be adopted when implementing integrated-circuit devices and semiconductor integrated circuitry.
Figure 1B:
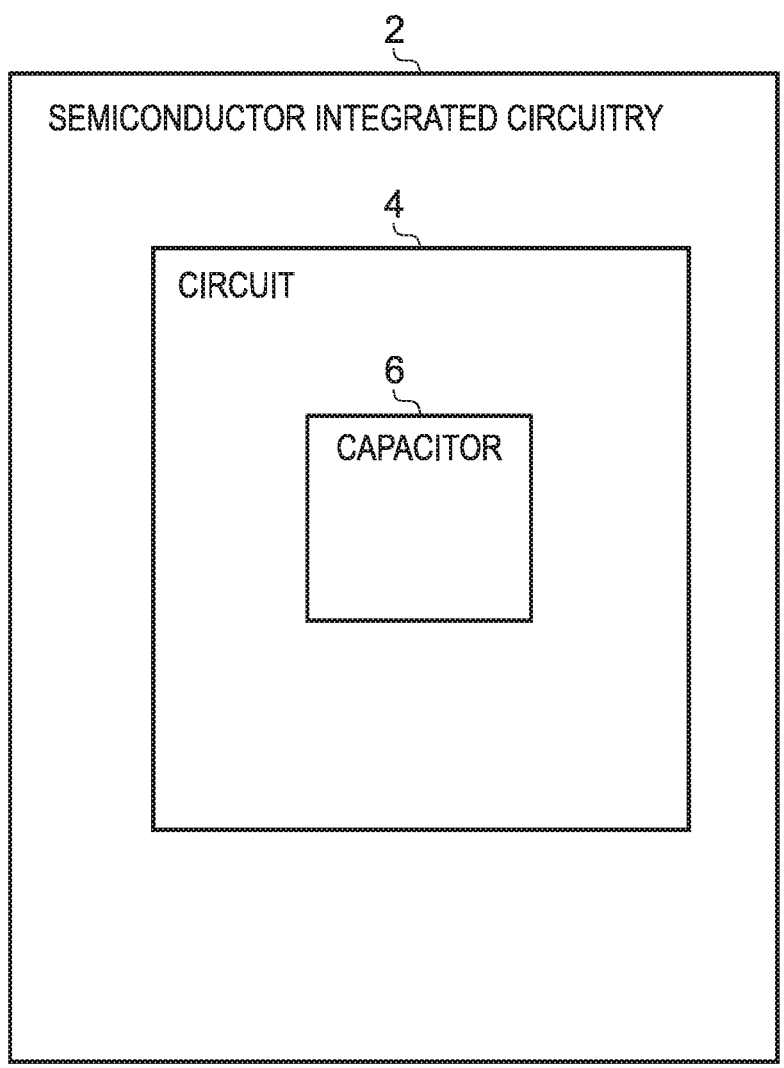
FIG. 1B is a schematic diagram of semiconductor integrated circuitry embodying the present invention.

FIG. 1B is a schematic diagram of semiconductor integrated circuitry 2 embodying the present invention, and is useful for appreciating the wide-ranging applications of embodiments of the present invention.

As indicated, a circuit 4 is implemented in the semiconductor integrated circuitry 2, and a capacitor 6 forms part of the circuit 4. The capacitor 6 in this respect may be or be part of an integrated-circuit device implemented in the semiconductor integrated circuitry 2. The circuit 4 may of course be part of a larger circuit which is only partly implemented in the semiconductor integrated circuitry 2. In some instances, the circuit 4 may be the capacitor 6 in which case the semiconductor integrated circuitry 2 may itself be referred to as an integrated-circuit device or integrated-circuit capacitor.

In overview, FIGS. 2 to 11 are schematic diagrams together presenting representative parts 100 and 200 of first and second comparative example integrated-circuit devices (capacitors) alongside a corresponding representative part 300 of an integrated-circuit device (capacitor) embodying the present invention, for ease of comparison. The devices may be referred to as circuitry components such as passive components.

The representative parts 100, 200, 300 of course may be considered capacitors in themselves, for example unit capacitors multiple instances of which may be combined, e.g. dynamically, to form larger "multi-unit" capacitors. Thus, the representative parts will be referred to as capacitors herein, as will combinations of those representative parts. The capacitor 300 is a detailed implementation of, or of part of, the capacitor 6.

FIGS. 2 to 11 will now be considered in combination. In each of FIGS. 2 to 11, part (a) relates to comparative example 1 (capacitor 100), part (b) relates to comparative example 2 (capacitor 200) and part (c) relates to the present embodiment (capacitor 300). The present embodiment is shown as distributed across metal layers M3 to M7 and the intermediate via layers VIA3 to VIA6 as an example, and for ease of comparison the comparative examples 1 and 2 are shown as distributed across the same layers.

Figure 2:
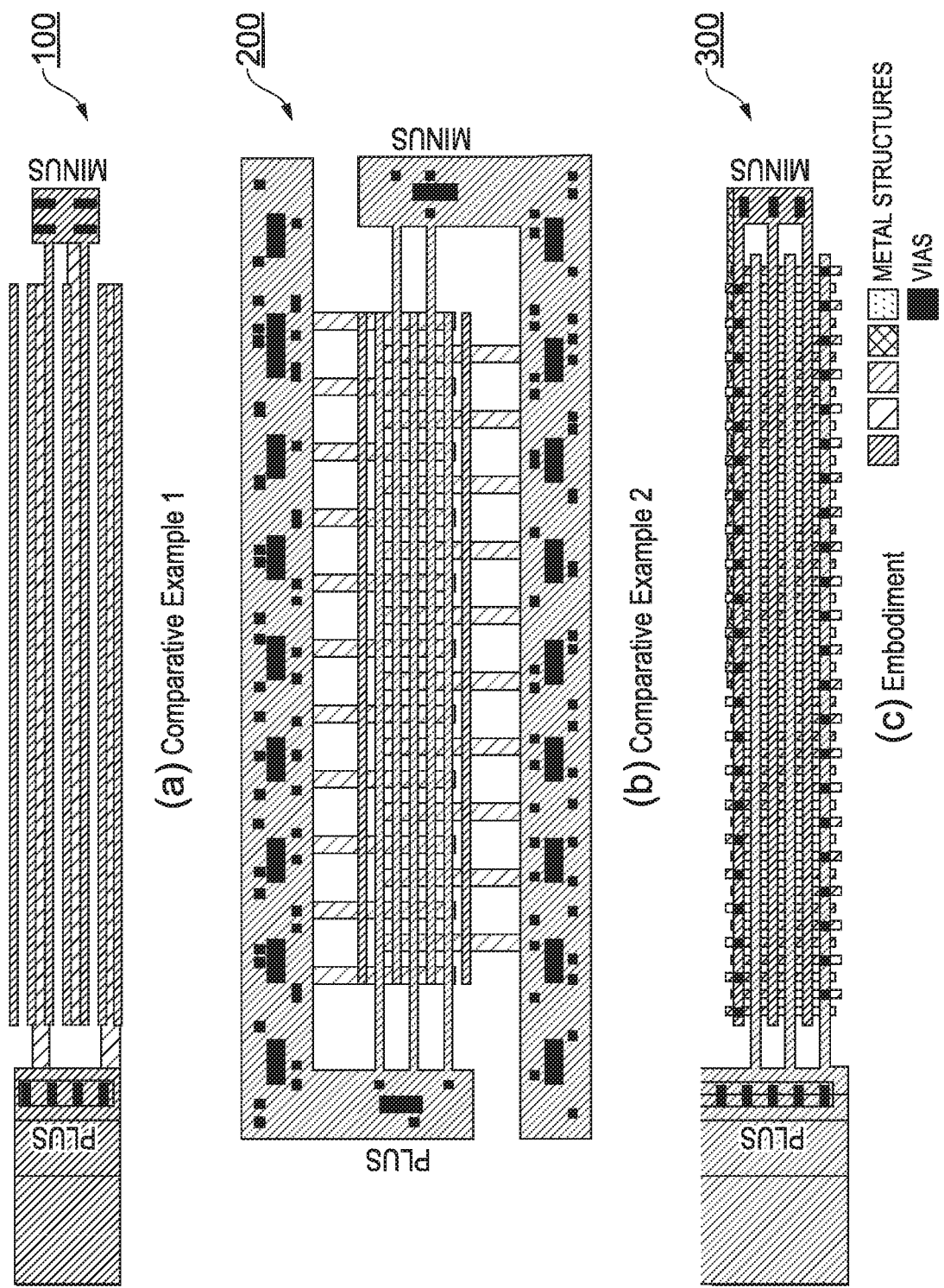
FIGS. 2 to 11 are schematic diagrams together presenting representative parts of first and second comparative example integrated-circuit devices alongside a corresponding representative part of an integrated-circuit device embodying the present invention, for ease of comparison.

Each of FIGS. 2 to 11 shows a plan view (looking down through the layers towards the substrate, i.e. in a downwards direction perpendicular to the layers), with a specific layer or layers represented as indicated. FIG. 2 is intended to give an overview of all of the layers M3 to M7 (with intermediate via layers VIA3 to VIA6) stacked in line with FIG. 1, although given the number of layers involved certain details are obscured and are best understood by reference to FIGS. 3 to 11.

FIGS. 3 to 7 show conductive structures (comprising conductive strips) formed in the individual layers M3 to M7, respectively. Those conductive structures may be considered metal structures formed from metal strips, and indeed the overall capacitor 300 may be considered a MOM capacitor.

Figure 8:
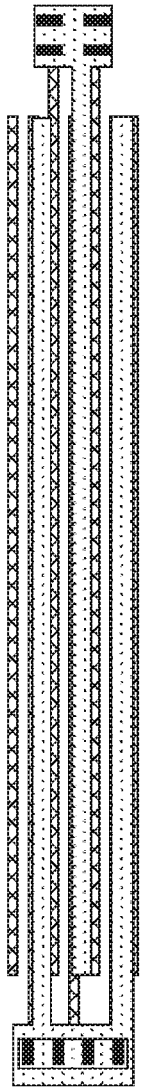
Figure 8:
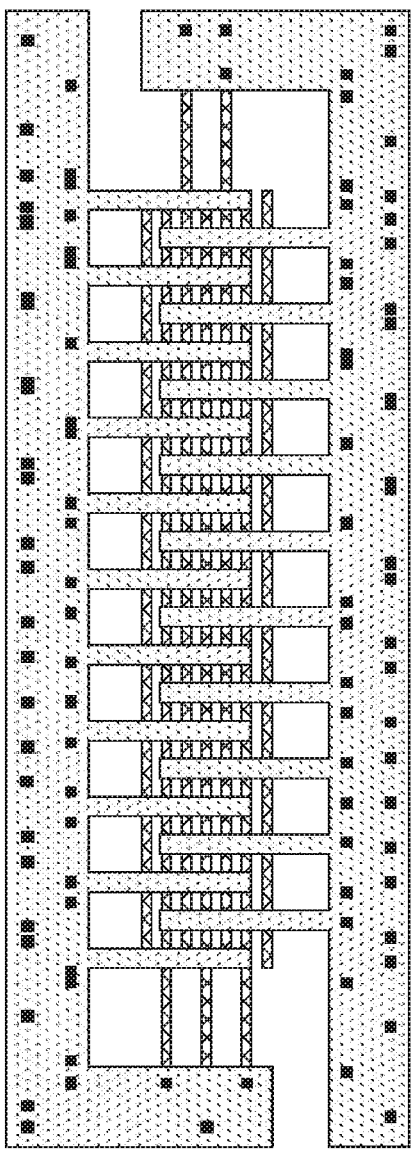
Figure 8:
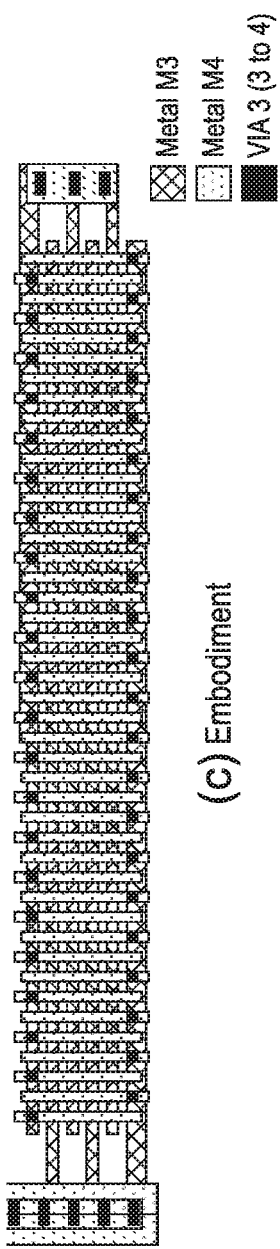
Figure 9:
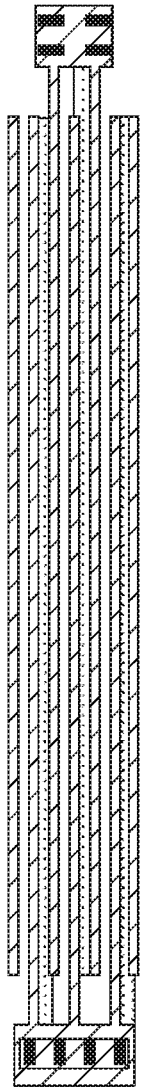
Figure 9:
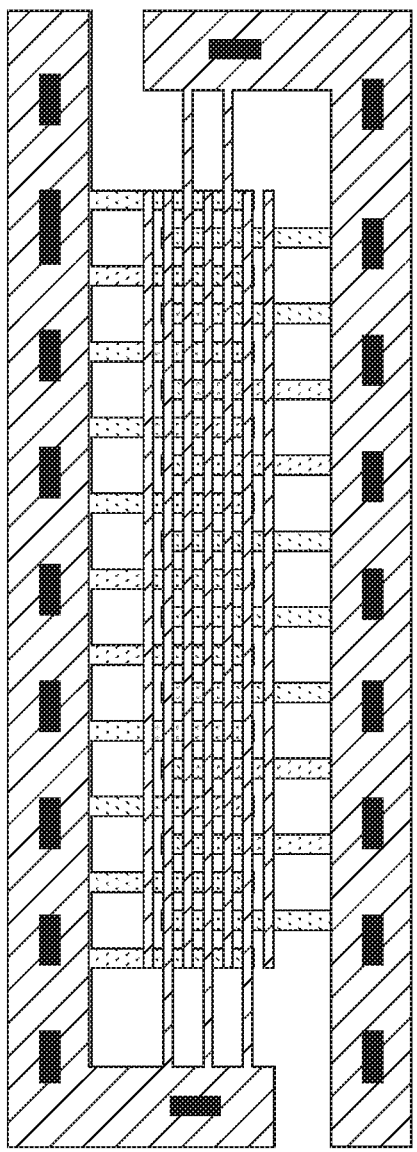
Figure 9:
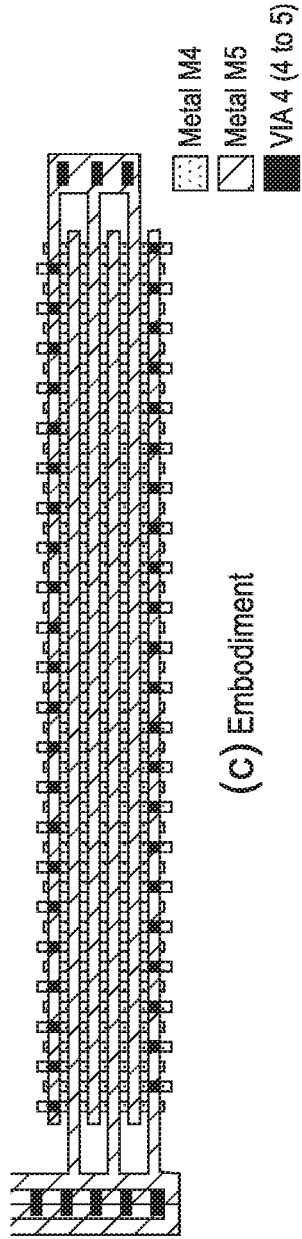
Figure 10:
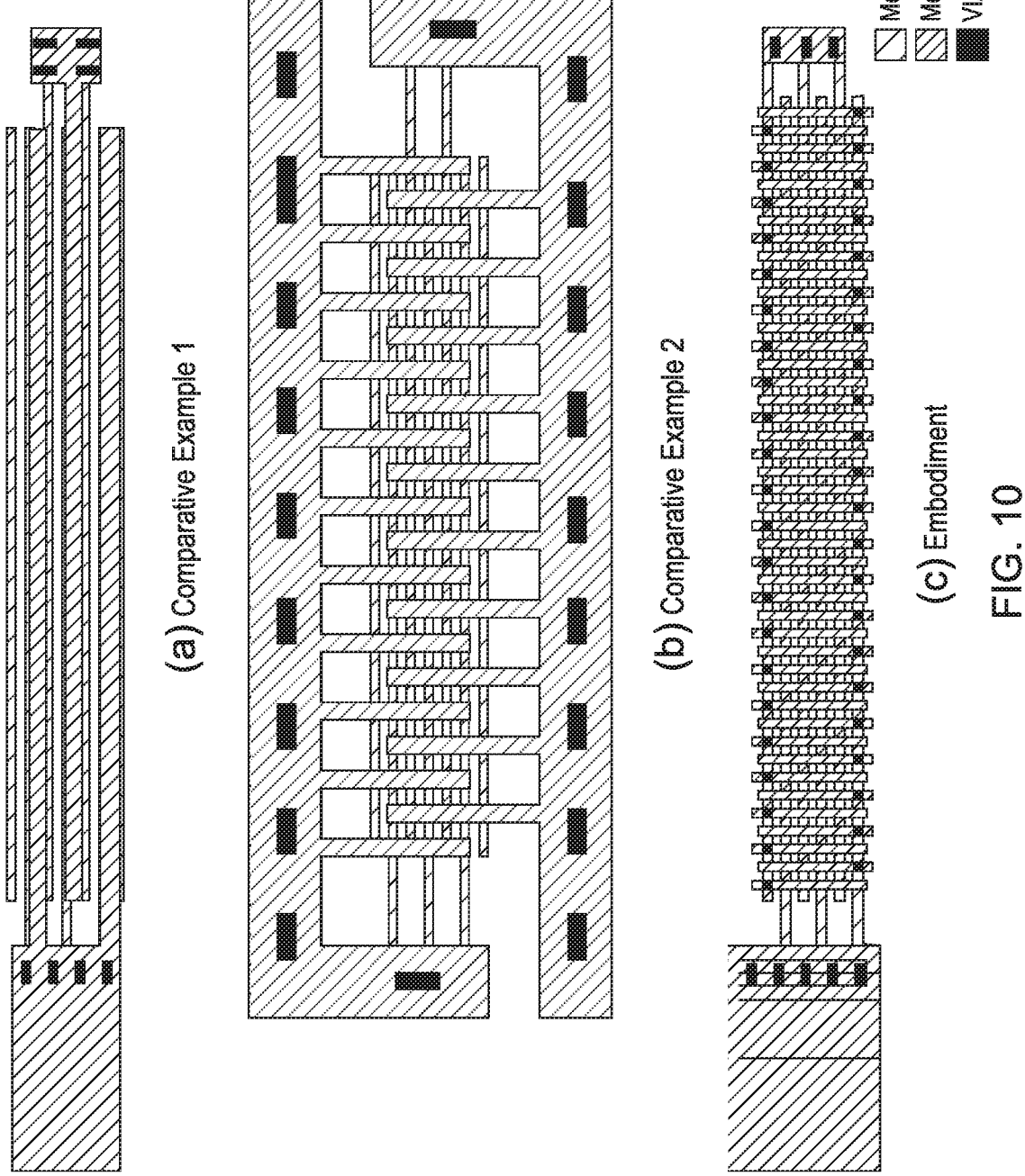
Figure 11:
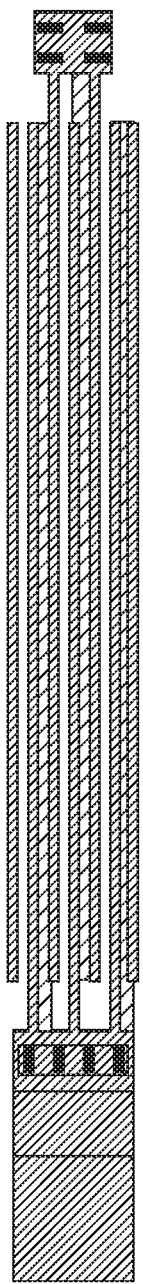
Figure 11:
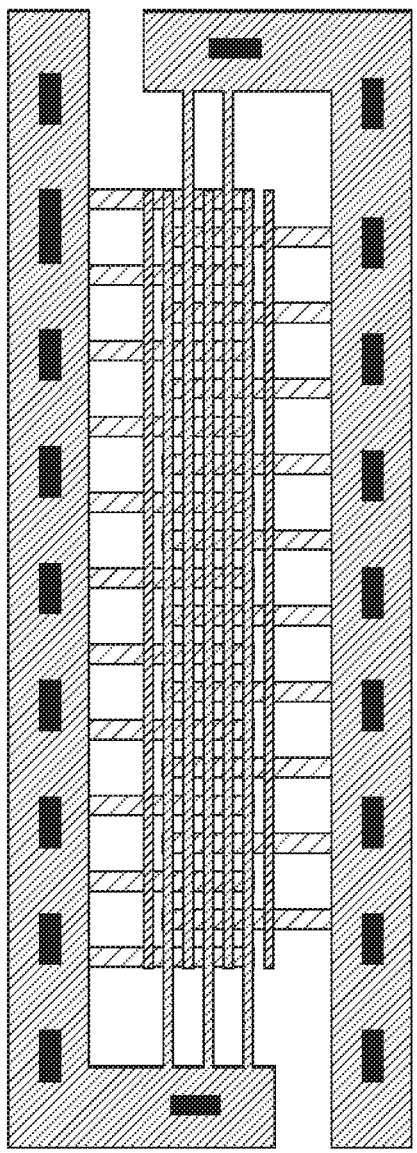
Figure 11:
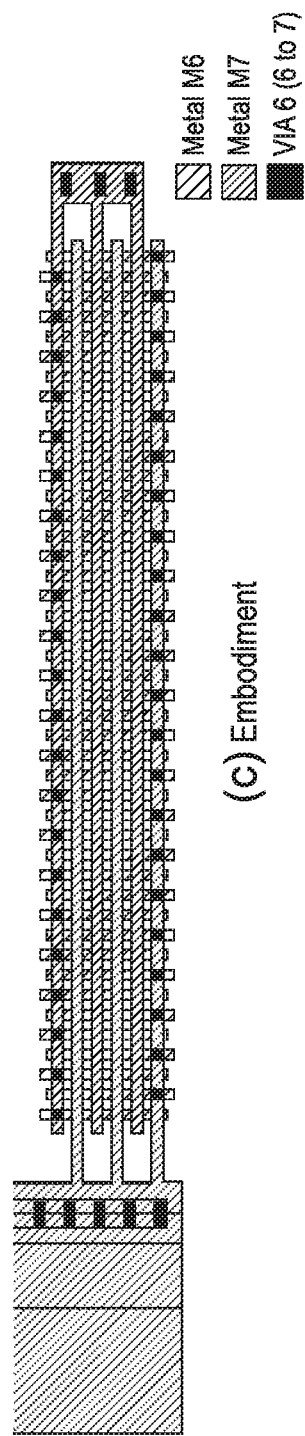

FIG. 8 shows conductive structures formed in layers M3 and M4, and vias formed in intermediate via layer VIA3 making connections from layer M3 to M4. Similarly, FIG. 9 shows conductive structures formed in layers M4 and M5 and vias formed in intermediate via layer VIA4 (making connections from layer M4 to M5), FIG. 10 shows conductive structures formed in layers M5 and M6 and vias formed in intermediate via layer VIA5 (making connections from layer M5 to M6), and FIG. 11 shows conductive structures formed in layers M6 and M7 and vias formed in intermediate via layer VIA6 (making connections from layer M6 to M7).

The embodiment (capacitor 300) of FIGS. 2 to 11 (see part (c) of those Figures) will first be described, before making comparisons with comparative examples 1 and 2 (capacitors 100 and 200).

Looking firstly at FIGS. 3 to 7, it can be seen that conductive (metal) structures are implemented in the wiring (metal) layers, and that those structures are made up of arrangements of conductive (metal) strips. Those arrangements and interconnections between them serve to form capacitor 300 (an integrated-circuit device), having first and second terminals, labelled as "PLUS" and "MINUS", respectively, in FIG. 2 (part (c)).

Figure 3:
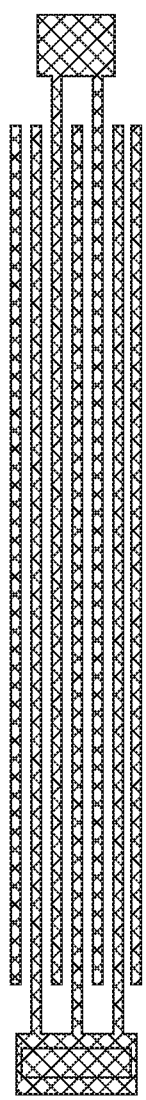
Figure 3:
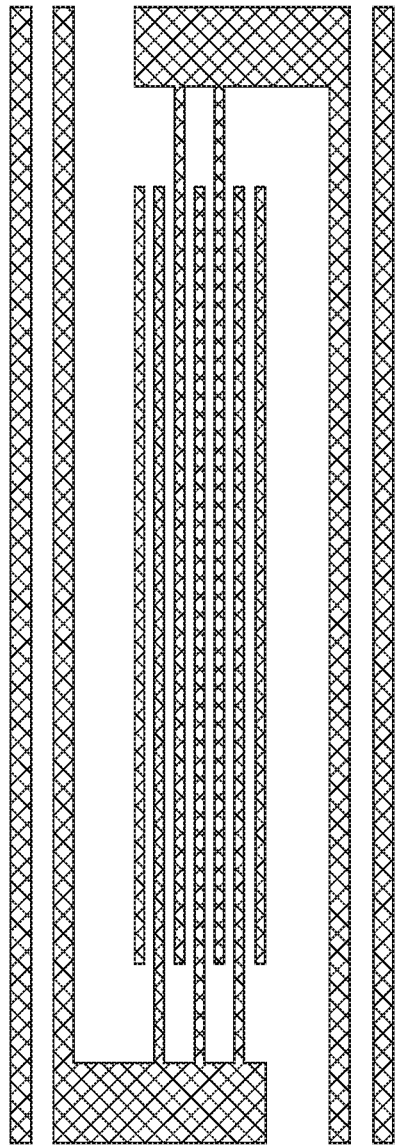
Figure 3:
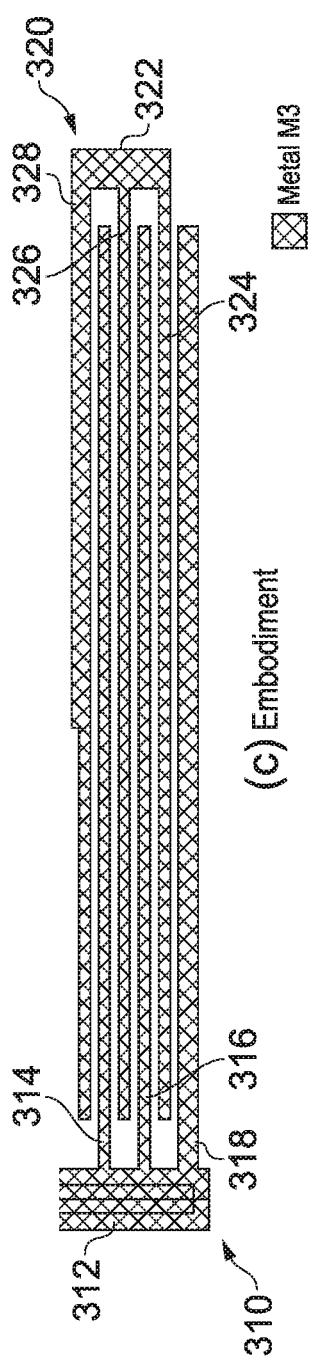

Looking firstly at FIG. 3 (part (c)), the strips formed in layer M3 (a first wiring layer) are organized into at least a first-terminal comb arrangement 310 conductively connected to the first terminal and a second-terminal comb arrangement 320 conductively connected to the second terminal.

The first-terminal comb arrangement 310 comprises a base strip 312 and a plurality of finger strips 314, 316 and 318 extending from the base strip 312. The finger strips 314 and 318 may be considered edge finger strips of the first-terminal comb arrangement 310, since they are the outermost finger strips of that comb arrangement. The second-terminal comb arrangement 320 comprises a base strip 322 and a plurality of finger strips 324, 326 and 328 extending from the base strip 322. The finger strips 324 and 328 may be considered edge finger strips of the second-terminal comb arrangement 320, since they are the outermost finger strips of that comb arrangement. Considering the first-terminal comb arrangement 310 and the second-terminal comb arrangement 320 in combination, the finger strips 318 and 328 may be referred to as edge finger strips of the combination, since they are the outermost finger strips of that combination.

The finger strips 314, 316, 318, 324, 326, 328 generally have the same lengths as one another (measured left-right in FIG. 3) and the same widths as one another (measured up-down in FIG. 3). The finger strip 318 appears to have a slightly wider width than the finger strips 314 and 316, and the finger strip 328 appears to have a wider width than the finger strips 324 and 326 over part of its length, however these are implementation details and in other arrangements the widths of the finger strips may be uniform. The base strips 312 and 322 have widths (measured left-right in FIG. 3) which are larger than the widths of the figure strips. The widths and lengths, and corresponding areas of the strips, are measured parallel to the layers.

The first-terminal and second-terminal comb arrangements 310, 320 oppose one another, in that their finger strips extend from their base strips towards one another. The first-terminal and second-terminal comb arrangements 310, 320 in this respect are interdigitated, so that their finger strips run alongside one another in an alternating arrangement. To facilitate this, the first-terminal and second-terminal comb arrangements 310, 320 have generally the same structure as one another with their finger strips arranged with regular spacing.

Of course, although the first-terminal and second-terminal comb arrangements 310, 320 are shown having three finger strips each, this is merely an example and in general the comb arrangements may have two, three or more finger strips each. The first-terminal and second-terminal comb arrangements 310, 320 need not have the same number of finger strips as one another.

Figure 4:
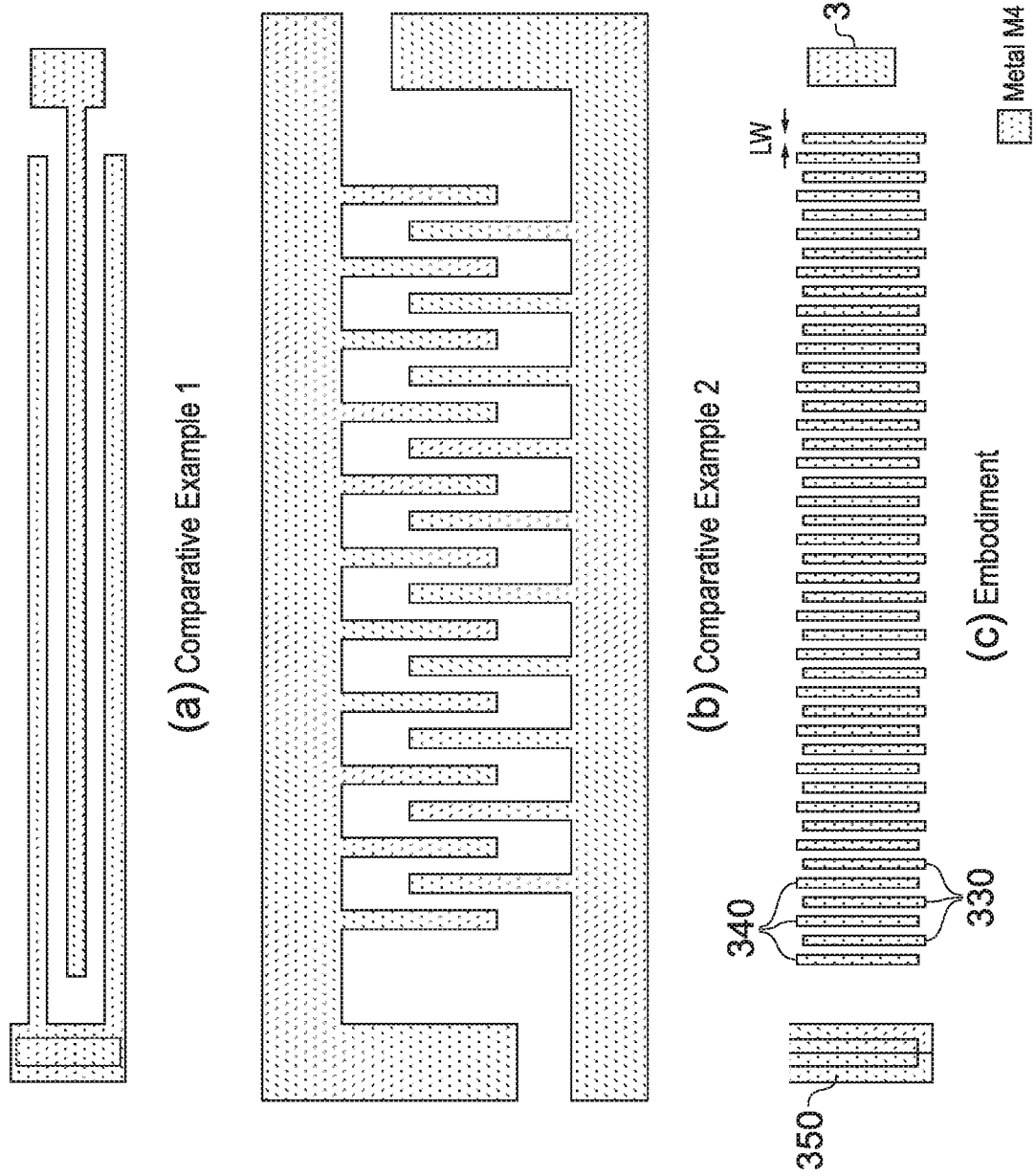

Turning to FIG. 4 (part (c)), the strips formed in layer M4 (a second wiring layer) comprise a plurality of separate strips 330 and 340 (only some of those strips have been labelled). The separate strips 330 are arranged alternately with the separate strips 340. That the strips 330 and 340 may be referred to as "separate" strips can be clearly seen from FIG. 4 (for example by comparison with the structures in FIG. 4 for comparative examples 1 and 2).

The strips 330 and 340 are for example conductively isolated from one another within layer M4, i.e. they are conductively isolated from one another taking into account only conductive connections formed solely in layer M4. Put another way, the strips 330 and 340 are each defined by a continuous or closed boundary, and are each conductively separate from other finger strips formed in layer M4 taking into account only conductive connections formed solely in that layer. The strips 330 and 340 are each non-contiguous with other finger strips formed in layer M4 and (as will become apparent) are each conductively connected to another strip only by way of a via. The separate strips could be referred to thus as isolated, island, individual, independent, freestanding unjoined-up or detached strips.

Taking into account FIG. 8, the separate strips formed in layer M4 comprise strips 330 which constitute finger strips of a cross-layer comb arrangement whose base strip is a finger strip (in this case, finger strip 318) of the first-terminal comb arrangement 310 of layer M3 to which those separate strips 330 are conductively connected by vias. Thus, the separate strips 330 form part of a comb arrangement (which extends across layers) without needing to form a base strip in layer M4 (in contrast to the comparative examples 1 and 2) and thus avoiding the associated area penalty as considered in more detail later. Similarly, the separate strips formed in layer M4 comprise strips 340 which constitute finger strips of a cross-layer comb arrangement whose base strip is a finger strip (in this case, finger strip 328) of the second-terminal comb arrangement 320 of layer M3 to which those separate strips 340 are conductively connected by vias. Thus, the separate strips 340 also form part of a comb arrangement without needing to form a base strip in layer M4 (i.e. in the same layer as the strips 340).

Whereas the finger strips 314, 316, 318, 324, 326, 328 extend generally parallel to one another in a first direction (left-right in FIG. 3), the finger strips 330, 340 extend generally parallel to one another in a second direction (up-down in FIG. 4), the first and second directions being different (generally perpendicular to one another in the present embodiment).

As before, the finger strips of the first-terminal comb arrangement 310 and the second-terminal comb arrangement 320 extend in opposite directions. Similarly, the finger strips 330 may be considered to extend in an opposite direction to the finger strips 340, with respect to the base strips of their cross-layer comb arrangements.

Similarly to the first-terminal and second-terminal comb arrangements 310, 320, the two cross-layer comb arrangements comprising finger strips 330 and 340, respectively, are interdigitated, so that their finger strips run alongside one another in an alternating arrangement. To facilitate this these cross-layer comb arrangements have generally the same structure as one another with the finger strips 330 and 340 arranged with regular spacing. Of course, the number of finger strips 330 and 340 shown in FIG. 4 is an example. In general two, three or more finger strips 330, and two, three or more finger strips 340 may be provided. The number of finger strips 330 need not be the same as the number of finger strips 340.

It can be seen from FIG. 4 that the finger strips 330 and 340 generally have the same lengths (up-down in FIG. 4) as one another and the same widths (left-right in FIG. 4) as one another. The widths and lengths, and corresponding areas of the strips, are measured parallel to the layers. Note that the finger strips 330 are shifted slightly downwards in FIG. 4 relative to the finger strips 340, corresponding to the connections by way of vias to the edge finger strips 318 and 328, respectively (see FIG. 8). As mentioned earlier, the finger strips 318 and 328 may be referred to as edge finger strips of the combination of the first-terminal and second-terminal comb arrangements 310, 320.

The finger strips 318 and 328 accordingly serve both as finger strips of the first-terminal and second-terminal comb arrangements 310, 320 and as base strips of the two cross-layer comb arrangements comprising finger strips 330 and 340, respectively.

Figure 5:
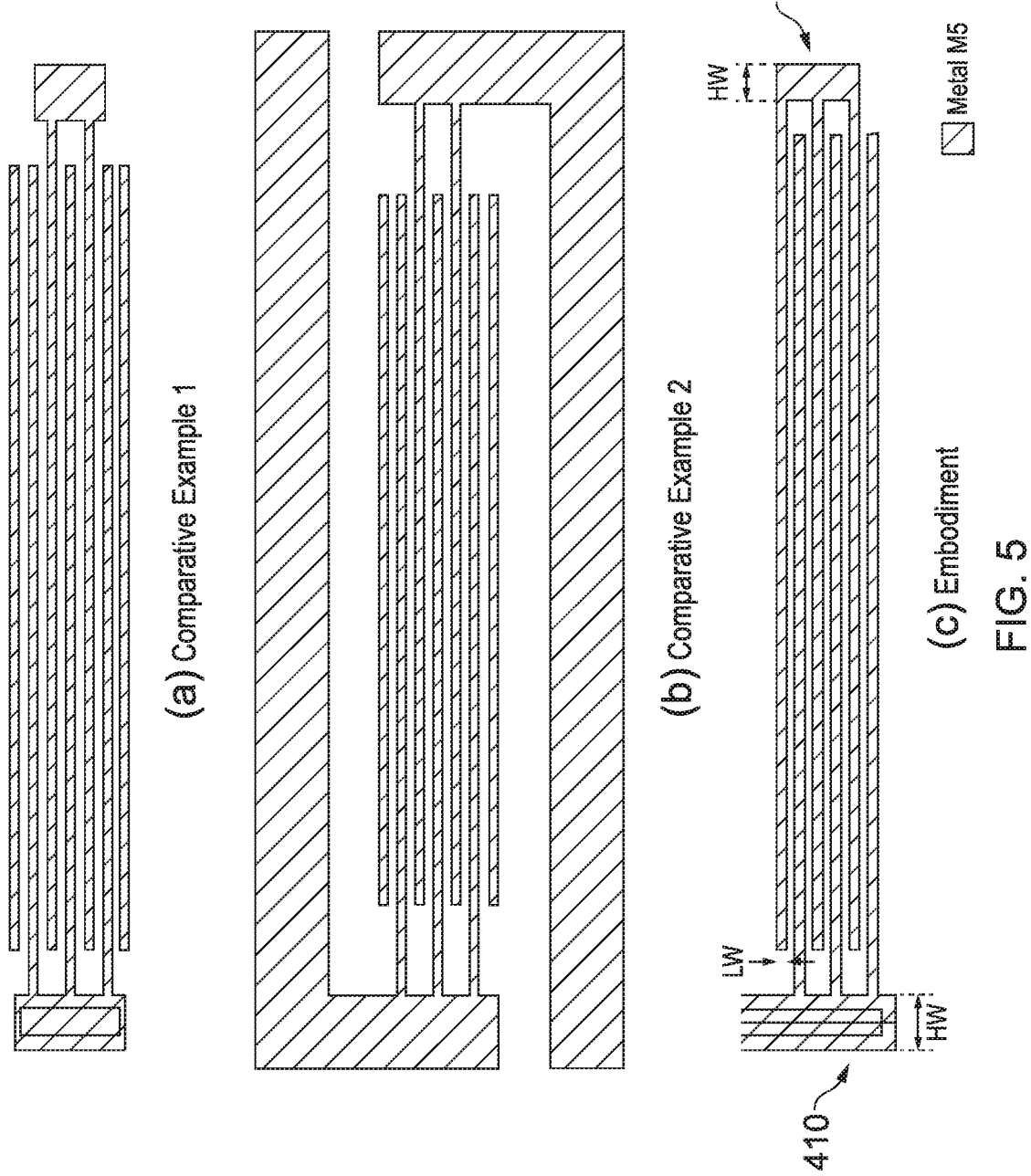

Turning to FIG. 5 (part (c)), the strips formed in layer M5 (a third wiring layer) are organized into at least a first-terminal comb arrangement 410 conductively connected to the first terminal and a second-terminal comb arrangement 420 conductively connected to the second terminal. The first-terminal comb arrangement 410 (similarly to the first-terminal comb arrangement 310) comprises a base strip and a plurality of finger strips extending from the base strip. The second-terminal comb arrangement 420 (similarly to the second-terminal comb arrangement 320) comprises a base strip and a plurality of finger strips extending from the base strip.

Figure 6:
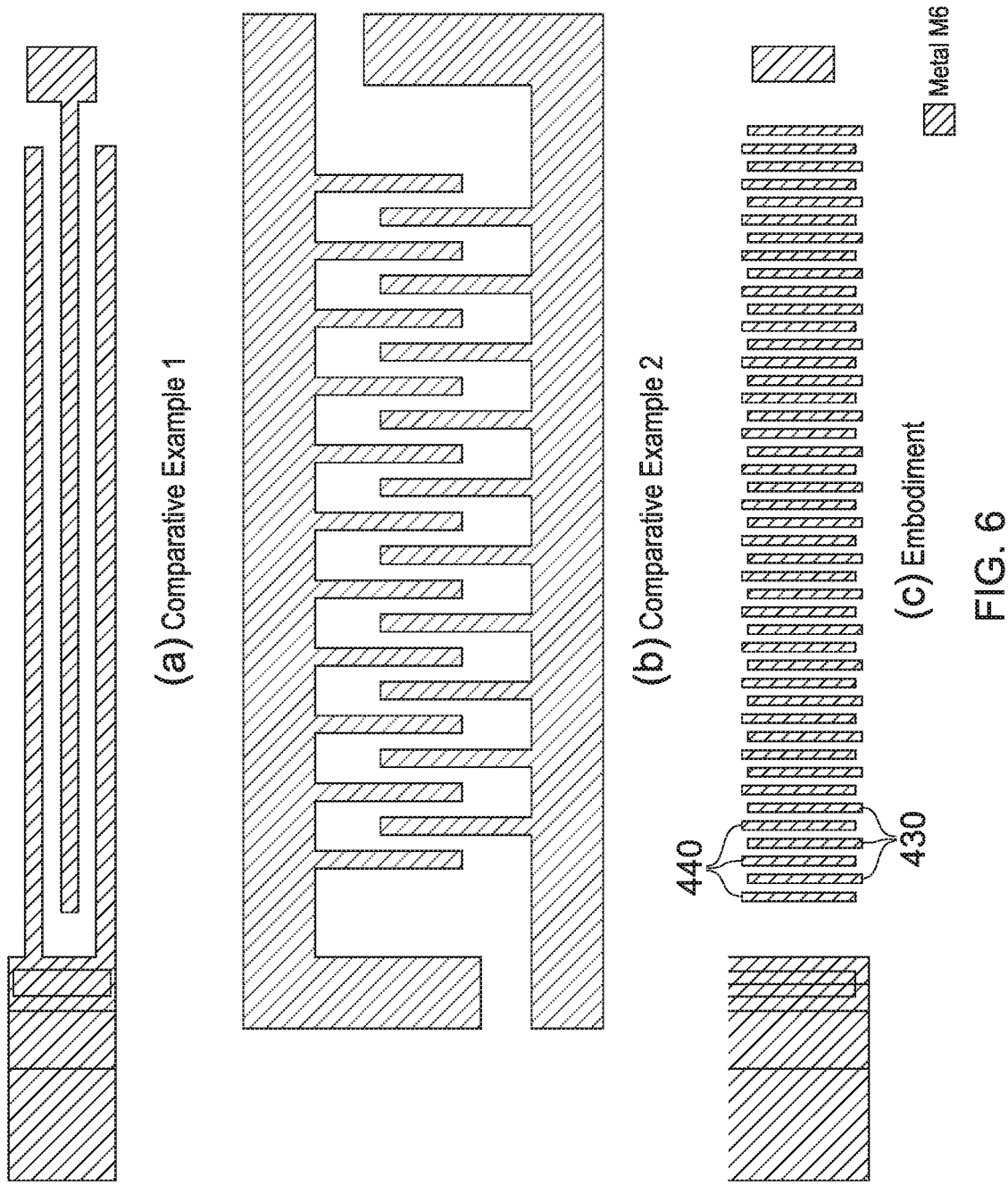

Turning to FIG. 6 (part (c)), the strips formed in layer M6 (a fourth wiring layer) comprise a plurality of separate strips 430 and 440 (only some of those strips have been labelled). The separate strips 430 are arranged alternately with the separate strips 440.

Figure 7:
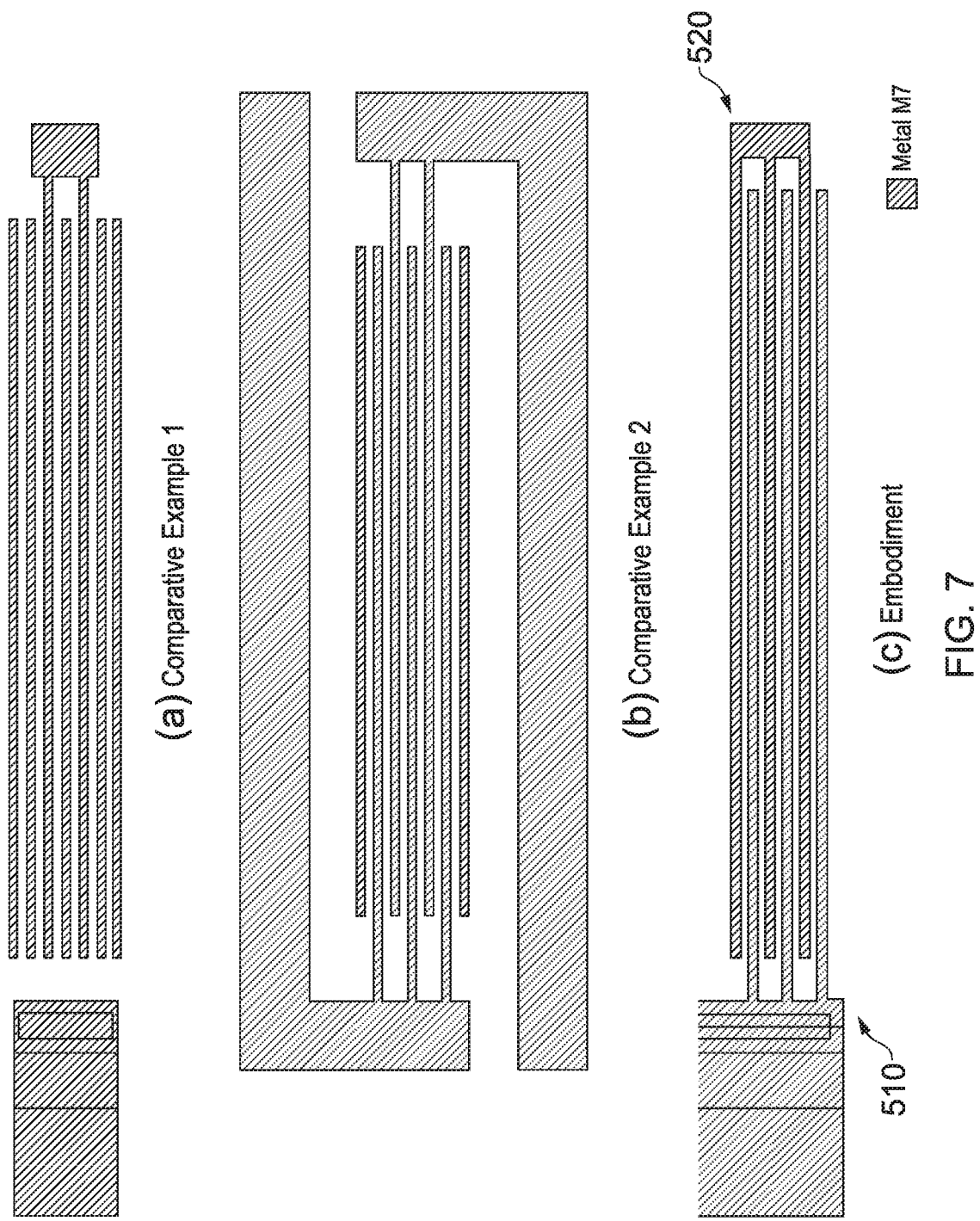

Turning to FIG. 7 (part (c)), the strips formed in layer M7 (a fifth wiring layer) are organized into at least a first-terminal comb arrangement 510 conductively connected to the first terminal and a second-terminal comb arrangement 520 conductively connected to the second terminal. The first-terminal comb arrangement 510 (similarly to the first-terminal comb arrangement 310) comprises a base strip and a plurality of finger strips extending from the base strip. The second-terminal comb arrangement 520 (similarly to the second-terminal comb arrangement 320) comprises a base strip and a plurality of finger strips extending from the base strip.

The considerations regarding the first-terminal and second-terminal comb arrangements 310, 320 of FIG. 3 (layer M3) apply equally to the first-terminal and second-terminal comb arrangements 410, 420 of FIG. 5 (layer M5), and to the first-terminal and second-terminal comb arrangements 510, 520 of FIG. 7 (layer M7), and duplicate description may be omitted. Similarly, the considerations regarding the separate strips 330 and 340 of FIG. 4 (layer M4) apply equally to the separate strips 430 and 440 of FIG. 6 (layer M6), and duplicate description may be omitted.

For example, in the present embodiment, the first-terminal and second-terminal comb arrangements 410, 420 of FIG. 5 (layer M5) have the same number of finger strips, with the same lengths and widths as for the first-terminal and second-terminal comb arrangements 310, 320 of FIG. 3 (layer M3). Indeed, the finger strips in layer M5 overlap the corresponding finger strips in layer M3. Similarly, the finger strips in layer M7 overlap the corresponding finger strips in layers M3 and M5. As another example, the separate strips 430 and 440 are the same in number and arrangement as the separate strips 330 and 340, with the strips 430 and 440 of layer M6 overlapping the corresponding strips 330 and 340 of layer M4.

It can been seen in FIGS. 3 to 11, and explicitly in FIGS. 4 and 5, that in this embodiment the finger strips have widths within a lower range of widths (LW) and that the base strips (e.g. strips 312 and 322) of the comb arrangements other than the cross-layer comb arrangements have widths within a higher range of widths (HW), the higher range of widths (HW) comprising widths larger than those in the lower range of widths (LW). Thus, although the various finger widths are shown as being uniform, this is one example and the widths could differ within the appropriate ranges.

It can be seen by comparing FIGS. 3, 5 and 7 that the base strips (e.g. strips 312 and 322) of the first-terminal and second-terminal comb arrangements are generally configured in the same way as one another, e.g. to have similar lengths and widths between the layers. Significant additional conductive area is provided to the first terminal (PLUS) in layer M7, however this is merely an implementation detail.

In FIG. 4, additional strips 350 and 360 are shown corresponding to the base strips 312 and 322, respectively. Corresponding additional strips are also shown in FIG. 6. It will be apparent from FIGS. 8 to 11 that these facilitate connections of the various first-terminal comb arrangements together (forming the first terminal of the capacitor 300) and connections of the various second-terminal comb arrangements together (forming the second terminal of the capacitor 300). Each comb arrangement conductively connected to the first terminal (PLUS) forms part of a distributed first-terminal plate of the capacitor 300 and each comb arrangement conductively connected to the second terminal (MINUS) forms part of a distributed second-terminal plate of the capacitor 300.

The skilled person will appreciate that the numbers of fingers and comb arrangements and their interconnections may vary from embodiment to embodiment.

For example, the strips 330 of layer M4 are shown connected (downwards) by vias to a finger strip in layer M3 and (upwards) by vias to a finger strip in layer M5, however they could be connected only to layer M3 or only to layer M5 (or some only to layer M3 and some only to layer M5). The strips 340 of layer M4 similarly are shown connected (downwards) by vias to a finger strip in layer M3 and (upwards) by vias to a finger strip in layer M5, however they could be connected only to layer M3 or only to layer M5 (or some only to layer M3 and some only to layer M5). Each of those strips could be connected only to layer M3 or only to layer M5 or to both of layers M3 and M5, with any such connection only to one of layers M3 and M5 being achieved by omitting the relevant via or vias from FIG. 8 or 9. Similar considerations apply to the strips 430 and 440 of layer M6.

As another example, the strips 330 and 340 of layer M4 are shown connected by vias at their end portions (e.g. edge portions, or simply at their ends), to connect to edge finger strips in layers M3 and M5. However, they could be connected to other finger strips in layers M3 and M5.

As another example, the intedigitation (intermeshing) is shown on a regular finger-by-finger basis (mutually alternately), however the intedigitation could for example be on a pair of fingers-by-pair of fingers basis, or irregular.

As another example, the capacitor 300 is shown comprising three odd-numbered layers (M3, M5, M7, or first, third and fifth layers) and two even-numbered layers (M4, M6, or second and fourth layers). However, layers M5 to M7, or M6 and M7, could be omitted. As another example, either the strips 330 or the strips 340 of layer M4 could be omitted, with similar considerations applying to layer M6. As another example, further even and/or odd layers (e.g. M8 and/or M9) could be employed with any further odd layer having comb structures corresponding to those in M3, M5 and M7, and with any further even layer having separate strips corresponding to those in M4 and M6. Incidentally, in the present embodiment the layers M3 to M7 are consecutive wiring layers of the layer structure, but need not be.

Looking at the embodiment of FIGS. 3 to 7, the finger strips of each wiring layer extend generally parallel to one another. The finger strips of (odd-numbered) layers M3, M5 and M7 extend generally parallel to one another, and the finger strips of (even-numbered) layers M4 and M6 extend generally parallel to one another. Indeed, the finger strips are generally straight with parallel sides, and define rectangles. Further, when viewed in a direction perpendicular to the layers, the finger strips of odd and even-numbered layers overlap or cross over one another to define a grid, for example as apparent from FIG. 8 (in connection with layers M3 and M4) or indeed from any of FIGS. 9 to 11.

Looking at FIGS. 8 to 11, it is apparent that this grid structure with the base strips of the cross-layer comb arrangements being finger strips of the first-terminal or second-terminal comb arrangements (of the odd-numbered layers) leads to a very compact capacitor structure and thus a high capacitance per unit area. For example, the separate strips of the even-numbered wiring layers (e.g. M4) extend in a direction parallel to the layers substantially only between edge finger strips of for example the combination of a pair of first-terminal and second-terminal comb arrangements formed in an odd-numbered wiring layer (e.g. M3). That is, the separate strips of the even-numbered wiring layers (e.g. M4) effectively underlie or overlie an area already occupied by finger strips in an odd-numbered wiring layer (e.g. M3). For example, at least 80 or 90 percent of the lengths of the separate strips of the even-numbered wiring layers extend between edge finger strips of a combination of a pair of first-terminal and second-terminal comb arrangements formed in at least one odd-numbered wiring layer. This is also apparent from FIG. 2.

As mentioned earlier, the capacitor 300 may be considered a unit capacitor and in this respect a part of a larger multi-unit capacitor made up of a plurality of instances of the capacitor 300. Those instances of capacitor 300 may for example occupy the same layers of the layers structure and be positioned alongside one another (e.g. in an array) when viewed downwards through the layers. The number of such instances which are conductively connected together may be controlled dynamically thus implementing a variable capacitor (multi-unit capacitor) using a bank of switched capacitors 300. As the number of such unit capacitors 300 making up a multi-unit capacitor increases, the benefit of the area gain afforded by the compact structure of the unit capacitor 300 increases too.

The embodiment of part (c) of FIGS. 3 to 11 will now be compared with the comparative examples of parts (a) and (b) of those Figures. That is, capacitor 300 will now be compared with capacitors 100 and 200.

The MOM structure of comparative example 1 (capacitor 100) uses per-layer comb structures throughout as indicated, with the fingers extending parallel to one another across the layers. This structure does not exploit overlap capacitance (achieved by the grid structure in the present embodiment) and relies only on side wall capacitance. Also, for some technologies the fingers in some of the layers extend in a "non-preferred" direction in which they cannot take advantage of minimum width and spacing. The capacitance per unit area of the comparative example 1 (capacitor 100) is thus not as high as for the present embodiment.

The MOM structure of comparative example 2 (capacitor 200) again uses per-layer comb structures throughout as indicated, but with the fingers extending parallel to one another across alternate layers and perpendicular to one another across adjacent layers. This creates a grid structure, with the beneficial additional overlap capacitance (as for the present embodiment). Also, for some technologies the fingers in all of the layers extend in a "preferred" direction in which they can take advantage of minimum width and spacing (as for the present embodiment). Thus, the capacitance per unit area is improved in these respects as compared to comparative example 1 (capacitor 100). However, in order to increase Q the MOM fingers are connected to L-shaped base strips as indicated, which occupy significant layout area and reduce the capacitance that can be achieved in the available area.

The MOM structure of the present embodiment (capacitor 300) enjoys the grid structure of finger strips across the layers to exploit the additional overlap capacitance and, for some technologies, "preferred" direction per layer (allowing minimum width and spacing) as mentioned above. However, the finger strips are connected to the wide base strips only on two of the four sides of the capacitor (left and right sides in FIGS. 3 to 11), without needing wide base strips on the other two sides (top and bottom sides in FIGS. 3 to 11), which saves area. Considering the present embodiment (capacitor 300) shown in part (c) of FIGS. 3 to 11, an area such as a rectangular area parallel to the layers and sized to just encompass a combination of a pair of first-terminal and second-terminal comb arrangements formed in at least one odd-numbered wiring layer at least substantially encompasses the separate strips of at least one even-numbered wiring layer when viewed in a direction perpendicular to the layers.

The structure adopted in the present embodiment (capacitor 300) has a similar parasitic capacitance to the comparative example 1 (capacitor 100) while having a higher useful capacitance, and a lower parasitic capacitance than the comparative example 2 (capacitor 200) given the L-shaped pins are not needed. Thus the structure adopted in the present embodiment (capacitor 300) has a higher useful capacitance to parasitic capacitance ratio compared to both comparative example 1 (capacitor 100) and comparative example 2 (capacitor 200).

Although the L-shaped pins in comparative example 2 lead to improved Q, the effect of removing them in the structure adopted in the present embodiment is relatively small. Put simply, the structure adopted in the present embodiment rotates fingers by 90 degrees from wiring layer to wiring layer but without needing the L-shaped structures of the comparative example 2. This structure maximizes (increases) capacitance per unit area, and also maximizes (increases) the useful capacitance to parasitic capacitance ratio. For circuits where this small decrease in Q can be tolerated, the higher capacitance per unit area and increased useful capacitance to parasitic capacitance ratio of embodiments of the present invention may be enjoyed.

Looking back at FIG. 1B, the capacitor (integrated-circuit device) 300 being a detailed implementation of capacitor 6 may form part of semiconductor integrated circuitry 2 having the layered structure. A circuit such as circuit 4 may be implemented at least partly in the semiconductor integrated circuitry 2, the circuit 4 comprising the capacitor 6, 300.

Figure 12:
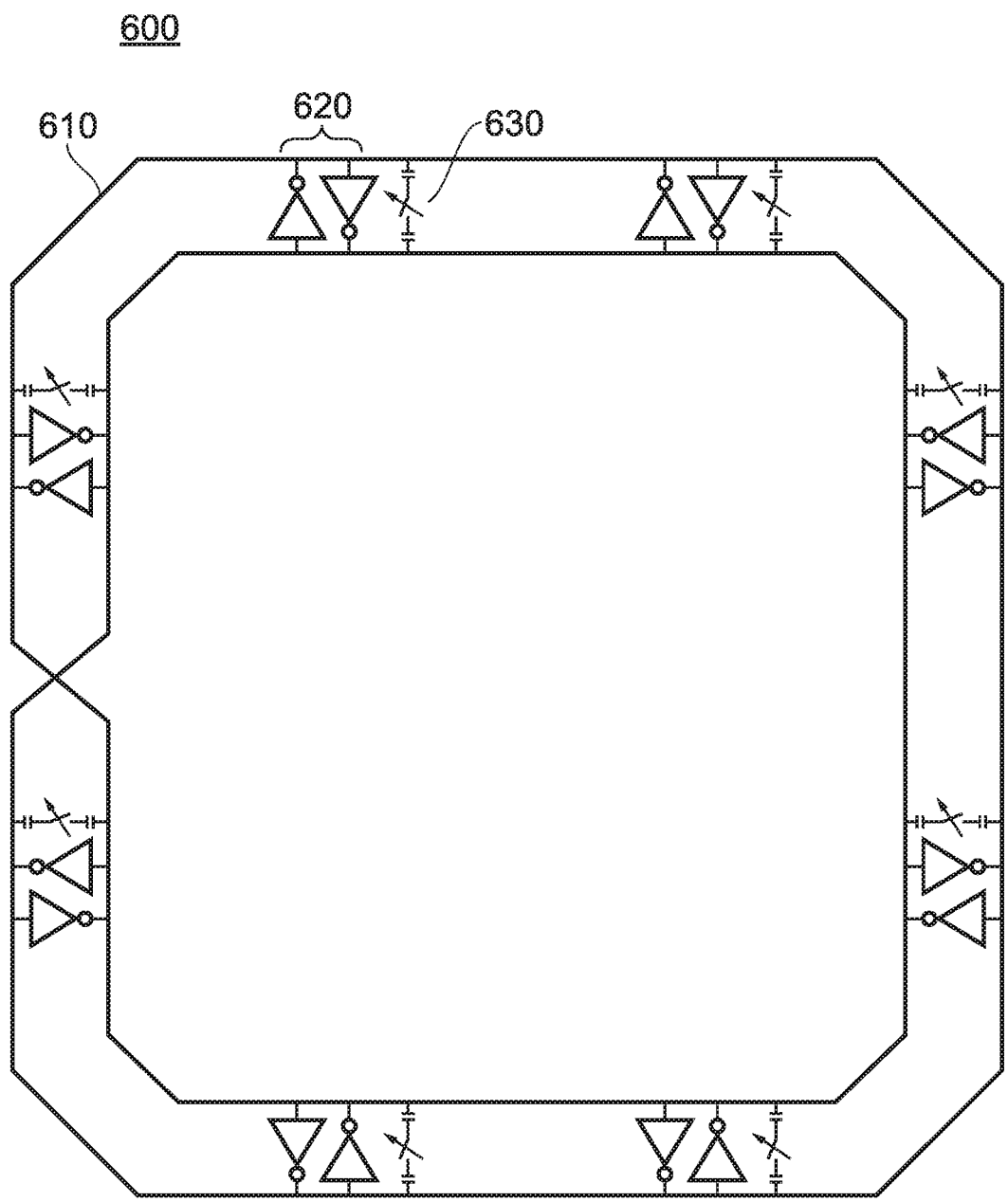
FIG. 12 is a schematic diagram of oscillator circuit embodying the present invention.

FIG. 12 is a schematic diagram of an oscillator circuit 600 embodying the present invention, in particular a rotating travelling wave (RTW) voltage controlled oscillator (VCO) circuit. The circuit 600 is an example of circuit 4.

The RTW VCO 600 comprises a transmission line (TL) 610 forming a loop. Inverter-pairs 620 connected to the TL compensate for the loss in the TL and sustain oscillation. The VCO oscillation frequency is controlled at least partly by band select capacitors 630. It will be assumed here that the band select capacitors 630 are each implemented as banks of switched capacitors each made up of instances (e.g. over 100) of capacitor 300. The capacitance value affects the wavelength of the travelling wave in the VCO and thus controls the frequency of oscillation.

In order to achieve a high VCO frequency range, a wide range in capacitance value (and thus a high upper capacitance value in the range) is needed. However, the area available is typically limited and gets smaller as the VCO frequency increases as a higher frequency VCO requires a smaller length TL.

By implementing the band select capacitors 630 as banks of switchable capacitors made up of capacitor 300, it is possible to achieve a wider capacitance range (and thus a wider frequency range) for a given available area.

It will be appreciated that the RTW VCO 600 is simply an example of circuit 4, and that other circuits (such as oscillator circuits) may be provided to make use of the capacitor 300. It will be appreciated that the capacitor 300 (capacitor 6), the circuit 4 (such as circuit 600) and the semiconductor integrated circuitry 2 each embody the present invention. A circuit such as an oscillator circuit comprising the capacitor 300 embodies the present invention.

Such integrated-circuit devices 6, 300 and integrated circuitry 2 may be provided in the form of an IC (integrated circuit) chip, and the IC chip may be provided as part of an IC package so that on-chip circuitry (implemented in the IC chip) can be connected with off-chip circuitry (implemented off the IC chip but connected thereto). In this context, the IC chip may be mounted on a package substrate of the IC package.

The present invention may be embodied in many different ways in the light of the above disclosure, within the spirit and scope of the appended claims.

The present disclosure extends to the following numbered statements.

S1. An integrated-circuit device having a layered structure, the layered structure comprising a plurality of wiring layers with a via layer sandwiched between adjacent said wiring layers, wherein:
a capacitor having first and second terminals is formed
from conductive structures implemented in at least first and second said wiring layers, the conductive structures comprising arrangements of conductive strips;

the strips formed in the first wiring layer are organized into at least a first-terminal comb arrangement conductively connected to the first terminal and a second-terminal comb arrangement conductively connected to the second terminal, each of those comb arrangements having a base strip and a plurality of finger strips extending from the base strip; and the strips formed in the second wiring layer comprise a plurality of separate strips which constitute finger strips of a cross-layer comb arrangement whose base strip is a finger strip of the first-terminal comb arrangement of the first wiring layer to which those separate strips are conductively connected by vias.

S2. The integrated-circuit device according to statement S1, wherein:

the strips formed in the second wiring layer comprise a plurality of separate strips which constitute finger strips of a cross-layer comb arrangement whose base strip is a finger strip of the second-terminal comb arrangement of the first wiring layer to which those separate strips are conductively connected by vias.

S3. The integrated-circuit device according to statement S1 or S2, wherein:

at least a part of said conductive structures is implemented in a third said wiring layer located in the layered structure on the opposite side of the second wiring layer from the first wiring layer;

the strips formed in the third wiring layer are organized into at least a first-terminal comb arrangement conductively connected to the first terminal and a second-terminal comb arrangement conductively connected to the second terminal, each of those comb arrangements having a base strip and a plurality of finger strips extending from the base strip; and the strips formed in the second wiring layer comprise:
  a plurality of separate strips which constitute finger strips of a cross-layer comb arrangement whose base strip is a finger strip of the first-terminal comb arrangement of the third wiring layer to which those separate strips are conductively connected by vias; and/or
  a plurality of separate strips which constitute finger strips of a cross-layer comb arrangement whose base strip is a finger strip of the second-terminal comb arrangement of the third wiring layer to which those separate strips are conductively connected by vias.

S4. The integrated-circuit device according to statement S3, wherein:

at least a plurality of the finger strips formed in the second wiring layer are finger strips of both a said cross-layer comb arrangement whose base strip is a finger strip formed in the first wiring layer and a said cross-layer comb arrangement whose base strip is a finger strip formed in the third wiring layer.

S5. The integrated-circuit device according to statement S3 or S4, wherein:

at least a part of said conductive structures is implemented in a fourth said wiring layer located in the layered structure on the opposite side of the third wiring layer from the second wiring layer, and in a fifth said wiring layer located in the layered structure on the opposite side of the fourth wiring layer from the third wiring layer;

the strips formed in the fifth wiring layer are organized into at least a first-terminal comb arrangement conductively connected to the first terminal and a second-terminal comb arrangement conductively connected to the second terminal, each of those comb arrangements having a base strip and a plurality of finger strips extending from the base strip; and the strips formed in the fourth wiring layer comprise a plurality of separate strips which constitute finger strips of a cross-layer comb arrangement whose base strip is a finger strip of the first-terminal comb arrangement of the third wiring layer to which those separate strips are conductively connected by vias, and/or of a cross-layer comb arrangement whose base strip is a finger strip of the first-terminal comb arrangement of the fifth wiring layer to which those separate strips are conductively connected by vias.

S6. The integrated-circuit device according to statement S5, wherein:

the strips formed in the fourth wiring layer comprise a plurality of separate strips which constitute finger strips of a cross-layer comb arrangement whose base strip is a finger strip of the second-terminal comb arrangement of the third wiring layer to which those separate strips are conductively connected by vias, and/or of a cross-layer comb arrangement whose base strip is a finger strip of the second-terminal comb arrangement of the fifth wiring layer to which those separate strips are conductively connected by vias.

S7. The integrated-circuit device according to any of the preceding statements, wherein, for each said wiring layer, the finger strips of that wiring layer extend generally parallel to one another.

S8. The integrated-circuit device according to any of the preceding statements, wherein:

the finger strips of the first wiring layer or of the odd-numbered wiring layers extend generally parallel to one another; and/or the finger strips of the second wiring layer or of the even-numbered wiring layers extend generally parallel to one another; and/or the finger strips of the first wiring layer or of the odd-numbered wiring layers extend in a direction different from, or substantially perpendicular to, a direction in which the finger strips of the second wiring layer or of the even-numbered wiring layers extend.

S9. The integrated-circuit device according to any of the preceding statements, wherein, for at least one said wiring layer having finger strips of a pair of comb arrangements conductively connected to the first terminal and the second terminal, respectively, the finger strips of that pair of comb arrangements are interdigitated or intermeshed or arranged mutually alternately.

S10. The integrated-circuit device according to any of the preceding statements, wherein, for at least one said wiring layer having finger strips of a pair of comb arrangements conductively connected to the first terminal and the second terminal, respectively, the finger strips of the respective comb arrangements of that pair of comb arrangements extend in opposite directions and/or from their base strips towards one another.

S11. The integrated-circuit device according to any of the preceding statements, wherein:

for at least one said cross-layer comb arrangement, its base strip is an edge finger strip of the comb arrangement for which it is a finger strip; and/or for at least one said cross-layer comb arrangement, its finger strips are connected at end portions of those finger strips to its base strip by respective vias.

S12. The integrated-circuit device according to any of the preceding statements, wherein the finger strips of at least the first and second wiring layers, when viewed in a direction perpendicular to the layers, overlap or cross over one another to define a grid.

S13. The integrated-circuit device according to any of the preceding statements, wherein:
- the strips have widths and lengths parallel to the layers, the widths being within a lower range of widths or a higher range of widths, the higher range of widths comprising widths larger than those in the lower range of widths; and
- the finger strips have widths within the lower range of widths and the base strips of the comb arrangements other than the cross-layer comb arrangements have widths within the higher range of widths.

S14. The integrated-circuit device according to any of the preceding statements, wherein:
- the finger strips have substantially the same widths as one another; and/or
- the finger strips are substantially rectangular or straight when viewed in a direction perpendicular to the layers; and/or
- the finger strips of a given comb arrangement have substantially the same widths as one another; and/or
- the finger strips of a given comb arrangement have substantially the same widths and spacings between them; and/or
- the finger strips of a given comb arrangement have substantially the same lengths as one another; and/or
- the separate strips have substantially the same lengths as one another; and/or
- the finger strips of the first-terminal and second-terminal comb arrangements have substantially the same lengths as one another; and/or
- the first-terminal and second-terminal comb arrangements of a given odd-numbered wiring layer have substantially the same arrangement of finger strips as corresponding first-terminal and second-terminal comb arrangements of another odd-numbered wiring layer, and are optionally arranged so that corresponding finger strips overlap or occupy substantially the same area parallel to the layers when viewed in a direction perpendicular to the layers; and/or
- the first-terminal and second-terminal comb arrangements of a given odd-numbered wiring layer have substantially the same arrangement as corresponding first-terminal and second-terminal comb arrangements of another odd-numbered wiring layer, and are optionally arranged to overlap or occupy substantially the same area parallel to the layers when viewed in a direction perpendicular to the layers; and/or
- the separate strips of a given even-numbered wiring layer have substantially the same arrangement as corresponding separate strips of another even-numbered wiring layer, and are optionally arranged so that corresponding separate strips overlap or occupy substantially the same area parallel to the layers when viewed in a direction perpendicular to the layers.

S15. The integrated-circuit device according to any of the preceding statements, wherein:
- the separate strips of at least one even-numbered wiring layer extend in a direction parallel to the layers substantially only between edge finger strips of a combination of a pair of first-terminal and second-terminal comb arrangements formed in at least one odd-numbered wiring layer; and/or
- at least 80 or 90 percent of the lengths of the separate strips of at least one even-numbered wiring layer extend in a direction parallel to the layers between edge finger strips of a combination of a pair of first-terminal and second-terminal comb arrangements formed in at least one odd-numbered wiring layer; and/or
- an area such as a rectangular area parallel to the layers and sized to just encompass the finger strips of a combination of a pair of first-terminal and second-terminal comb arrangements formed in at least one odd-numbered wiring layer at least substantially encompasses the separate strips of at least one even-numbered wiring layer when viewed in a direction perpendicular to the layers; and/or
- an area such as a rectangular area parallel to the layers and sized to just encompass a combination of a pair of first-terminal and second-terminal comb arrangements formed in at least one odd-numbered wiring layer at least substantially encompasses the separate strips of at least one even-numbered wiring layer when viewed in a direction perpendicular to the layers, that area optionally defining an area of the integrated-circuit device occupied by the capacitor.

S16. The integrated-circuit device according to any of the preceding statements, wherein, for each said even-numbered wiring layer having separate strips which constitute finger strips, those finger strips are:
- conductively isolated from one another within that layer; and/or
- conductively isolated from one another taking into account only conductive connections formed solely in that layer; and/or
- each defined by a continuous or closed boundary; and/or
- each conductively separate from other finger strips formed in that layer taking into account only conductive connections formed solely in that layer; and/or
- each non-contiguous with other finger strips or other strips formed in that layer; and/or
- each conductively connected to another strip only by way of a via; and/or
- isolated, island, individual, independent, freestanding unjoined-up or detached strips.

S17. The integrated-circuit device according to any of the preceding statements, wherein the even-numbered and odd-numbered wiring layers are consecutive wiring layers of the wiring layers.

S18. The integrated-circuit device according to any of the preceding statements, comprising a substrate on which the layered structure is formed, an upwards direction being defined through the layers away from the substrate, wherein the first and second wiring layers are ordered in the layered structure in the upwards direction.

S19. The integrated-circuit device according to any of the preceding statements, wherein each comb arrangement conductively connected to the first terminal forms part of a distributed first-terminal plate of the capacitor and each comb arrangement conductively connected to the second terminal forms part of a distributed second-terminal plate of the capacitor.

S20. The integrated-circuit device according to any of the preceding statements, wherein said capacitor is a unit capacitor and wherein the integrated-circuit device comprises a plurality of said unit capacitors arranged in different areas of the integrated-circuit device when viewed in a direction perpendicular to the layers and connected or connectable together to form a multi-unit capacitor.

S21. Semiconductor integrated circuitry comprising the integrated-circuit device according to any of the preceding statements and having said layered structure, wherein a circuit is implemented at least partly in the semiconductor integrated circuitry and wherein the circuit comprises at least one said capacitor.

S22. The semiconductor integrated circuitry according to statement S21, wherein the circuit is or comprises:
an oscillator circuit; or
a rotary travelling wave voltage controlled oscillator circuit.

S23. A circuit such as an oscillator circuit comprising the integrated-circuit device according to any of statements S1 to S20 or the semiconductor integrated circuitry of statement S21 or S22.

S24. An IC chip comprising the integrated-circuit device according to any of statements S1 to S20 or the semiconductor integrated circuitry according to statement S21 or S22 or the circuit according to statement S23.

The invention claimed is:

1. An integrated-circuit device having a layered structure, the layered structure comprising a plurality of wiring layers with a via layer sandwiched between adjacent said wiring layers,
wherein:
a capacitor having first and second terminals is formed from conductive structures implemented in at least first and second said wiring layers, the conductive structures comprising arrangements of conductive strips;
the strips formed in the first wiring layer are organised into at least a first-terminal comb arrangement conductively connected to the first terminal and a second-terminal comb arrangement conductively connected to the second terminal, each of those comb arrangements having a base strip and a plurality of finger strips extending from the base strip; and
the strips formed in the second wiring layer comprise a plurality of separate strips which constitute finger strips of a cross-layer comb arrangement whose base strip is a finger strip of the first-terminal comb arrangement of the first wiring layer to which those separate strips are conductively connected by vias,
wherein:
at least a part of said conductive structures is implemented in a third said wiring layer located in the layered structure on the opposite side of the second wiring layer from the first wiring layer;
the strips formed in the third wiring layer are organised into at least a first-terminal comb arrangement conductively connected to the first terminal and a second-terminal comb arrangement conductively connected to the second terminal, each of those comb arrangements having a base strip and a plurality of finger strips extending from the base strip; and
the strips formed in the second wiring layer comprise:
a plurality of separate strips which constitute finger strips of a cross-layer comb arrangement whose base strip is a finger strip of the first-terminal comb arrangement of the third wiring layer to which those separate strips are conductively connected by vias; and/or
a plurality of separate strips which constitute finger strips of a cross-layer comb arrangement whose base strip is a finger strip of the second-terminal comb arrangement of the third wiring layer to which those separate strips are conductively connected by vias; and
at least a plurality of the finger strips formed in the second wiring layer are finger strips of both a said cross-layer comb arrangement whose base strip is a finger strip formed in the first wiring layer and a said cross-layer comb arrangement whose base strip is a finger strip formed in the third wiring layer.

2. The integrated-circuit device as claimed in claim 1, wherein:
the strips formed in the second wiring layer comprise a plurality of separate strips which constitute finger strips of a cross-layer comb arrangement whose base strip is a finger strip of the second-terminal comb arrangement of the first wiring layer to which those separate strips are conductively connected by vias.

3. The integrated-circuit device as claimed in claim 1, wherein:
the finger strips of the first wiring layer or of the odd-numbered wiring layers extend generally parallel to one another; and/or
the finger strips of the second wiring layer extend generally parallel to one another; and/or
the finger strips of the first wiring layer or of the odd-numbered wiring layers extend in a direction different from, or substantially perpendicular to, a direction in which the finger strips of the second wiring layer extend.

4. The integrated-circuit device as claimed in claim 1, wherein, for at least one said wiring layer having finger strips of a pair of comb arrangements conductively connected to the first terminal and the second terminal, respectively, the finger strips of that pair of comb arrangements are interdigitated or intermeshed or arranged mutually alternately.

5. The integrated-circuit device as claimed in claim 1, wherein:
for at least one said cross-layer comb arrangement, its base strip is an edge finger strip of the comb arrangement for which it is a finger strip; and/or
for at least one said cross-layer comb arrangement, its finger strips are connected at end portions of those finger strips to its base strip by respective vias.

6. The integrated-circuit device as claimed in claim 1, wherein the finger strips of at least the first and second wiring layers, when viewed in a direction perpendicular to the layers, overlap or cross over one another to define a grid.

7. The integrated-circuit device as claimed in claim 1, wherein:
the strips have widths and lengths parallel to the layers, the widths being within a lower range of widths or a higher range of widths, the higher range of widths comprising widths larger than those in the lower range of widths; and
the finger strips have widths within the lower range of widths and the base strips of the comb arrangements other than the cross-layer comb arrangements have widths within the higher range of widths.

8. The integrated-circuit device as claimed in claim 1, wherein:
the finger strips are substantially rectangular or straight when viewed in a direction perpendicular to the layers; and/or
the finger strips of a given comb arrangement have substantially the same lengths and/or widths as one another; and/or
the separate strips have substantially the same lengths as one another; and/or
the first-terminal and second-terminal comb arrangements of a given odd-numbered wiring layer have substantially the same arrangement of finger strips as corresponding first-terminal and second-terminal comb arrangements of another odd-numbered wiring layer, and are optionally arranged so that corresponding finger strips overlap or occupy substantially the same area parallel to the layers when viewed in a direction perpendicular to the layers; and/or the separate strips of the second wiring layer have substantially the same arrangement as corresponding separate strips of another even-numbered wiring layer, and are optionally arranged so that corresponding separate strips overlap or occupy substantially the same area parallel to the layers when viewed in a direction perpendicular to the layers.

9. The integrated-circuit device as claimed in claim 1, wherein:

the separate strips of the second wiring layer extend in a direction parallel to the layers substantially only between edge finger strips of a combination of a pair of first-terminal and second-terminal comb arrangements formed in at least one odd-numbered wiring layer; and/or at least 80 or 90 percent of the lengths of the separate strips of the second wiring layer extend in a direction parallel to the layers between edge finger strips of a combination of a pair of first-terminal and second-terminal comb arrangements formed in at least one odd-numbered wiring layer.

10. The integrated-circuit device as claimed in claim 1, wherein, for said second wiring layer having separate strips which constitute finger strips, those finger strips are each non-contiguous with other strips formed in that layer.

11. The integrated-circuit device as claimed in claim 1, wherein said capacitor is a unit capacitor and wherein the integrated-circuit device comprises a plurality of said unit capacitors arranged in different areas of the integrated-circuit device when viewed in a direction perpendicular to the layers and connected or connectable together to form a multi-unit capacitor.

12. Semiconductor integrated circuitry comprising the integrated-circuit device as claimed in claim 1 and having said layered structure, wherein a circuit is implemented at least partly in the semiconductor integrated circuitry and wherein the circuit comprises at least one said capacitor, optionally wherein the circuit is or comprises an oscillator circuit or a rotary travelling wave voltage controlled oscillator circuit.

13. A circuit such as an oscillator circuit comprising the integrated-circuit device as claimed in claim 1.

* * * * *